(12) United States Patent
Stricot et al.

(10) Patent No.: US 6,565,384 B2
(45) Date of Patent: May 20, 2003

(54) ELECTRO-OPTICAL CONNECTOR WITH FLEXIBLE CIRCUIT

(75) Inventors: Yves Stricot, Versailles (FR); Abdelkrim Belhora, Crosnes (FR); Jan Van Koetsem, Zwijndrecht (BE); Niranjan Kumar Mitra, Eindhoven (NL)

(73) Assignee: Framatome Connectors International, Courbevoie (FR)

( * ) Notice: Subject to any disclaimer, the term of this patent is extended or adjusted under 35 U.S.C. 154(b) by 0 days.

(21) Appl. No.: 10/027,962

(22) Filed: Oct. 25, 2001

(65) Prior Publication Data

US 2002/0115342 A1 Aug. 22, 2002

(30) Foreign Application Priority Data

Oct. 26, 2000 (FR) .............................................. 00 13769

(51) Int. Cl.$^7$ ...................... H01R 33/945; H01R 12/00; H05K 1/00; G02B 6/38
(52) U.S. Cl. ............................ 439/577; 439/67; 385/75
(58) Field of Search ............................. 439/67, 59, 69, 439/77, 493, 577; 361/760; 385/75

(56) References Cited

U.S. PATENT DOCUMENTS 4,364,619 A    12/1982  Inayat-Khan ................. 439/67
5,161,986 A  * 11/1992  Gulbranson et al. ........... 439/92
5,489,500 A  *  2/1996  Andrejack et al. ........... 370/235
5,947,753 A  *  9/1999  Chapman et al. ............. 439/79
6,305,848 B1 * 10/2001  Gregory ....................... 385/53
6,318,909 B1 * 11/2001  Giboney et al. .............. 385/90
6,320,750 B2 * 11/2001  Shaler et al. ................ 361/736
2002/0076164 A1 *  6/2002  Childers et al. .............. 385/76

FOREIGN PATENT DOCUMENTS

EP           0710861 A1    5/1996

* cited by examiner

Primary Examiner—Chandrika Prasad
(74) Attorney, Agent, or Firm—Perman & Green, LLP

(57) ABSTRACT

An electro-optical connection module (1) comprises a first end (30) designed to receive optical fibers (11), and comprises means (6) to convert a signal conveyed by these optical fibers into an electrical signal. These means are preferably placed on a rigid portion (4) of a printed circuit (2) contained in this module. Furthermore, this printed circuit portion is connected by means of a flexible printed circuit portion (13) to a printed circuit end (17). This printed circuit end has contacts (100) in the form of an electrical plug at one end (34) of this module. This second end is opposite to the first end of the module. Thus, the optical module is used for an electrical connection and comprises every means to convert the optical signal received into an electrical signal.

11 Claims, 2 Drawing Sheets

ELECTRO-OPTICAL CONNECTOR WITH FLEXIBLE CIRCUIT

An object of the present invention is an electro-optical connection module. It can be used especially in the field of connectors for optical transmitter and/or receiver connectors that can be connected to a printed circuit, especially in the field of connectors that convey signals with a frequency of over one gigabit. In the prior art, there is a known electro-optical connector comprising a package that receives one end of an optical fiber, this optical fiber being mounted in such a way that it can be presented so as to face an optical contact of a complementary connector. Furthermore, a connector of this kind has, at the same time, electrical contacts to be connected with complementary electrical contacts of the complementary connector. Should this connector be mounted on a printed circuit, the optical signal conveyed may, if necessary, be converted into an electrical signal in the printed circuit. The value of the invention is that it proposes an electro-optical module with electro-optical conversion means and, at the same time, this module can be mounted on a printed circuit.

In the prior art, there is a known optical connector with a package that receives at least one optical fiber. The optical fiber is positioned through the package in such a way that the end of this optical fiber is presented by the package so as to be placed facing a device complementary to this package. Furthermore, the package is used to accurately position the connector on the complementary device in such a way that the optical signal conveyed by the fiber is oriented towards an optical transmitter and/or receiver of this complementary device. As the case may be, the transmitter/receiver of the complementary device carries out the electro-optical conversion of this optical signal. A connector of this type makes it necessary for the package to be designed very precisely. And the location of the fiber in this package has to also be very precise to ensure the accurate positioning of the fiber before the transmitter/receiver of the complementary device.

Furthermore, in the prior art, there are also known electro-optical connectors comprising a device to receive optical fibers as well as electrical contacts that are connected to electrical cables and are presented so as to be connected with complementary contacts of the complementary device. The electrical contact is generally of the pin or socket type. In this case also, high mounting precision is needed to ensure the accurate positioning of these pins or sockets facing the pins or sockets of the complementary device.

The optical signal is conveyed through the connector. In a first case, the optical signal is sent by the connector towards the printed circuit which then receives this optical signal. In this case, the printed circuit comprises electro-optical conversion means to convert the optical signal received into an electrical signal. This signal can then be conveyed by tracks of the printed circuit to other electronic components of this circuit. In a second case, the optical signal conveyed by the connector is received from the printed circuit. In this case, the printed circuit has sent the optical signal. For example, one of the electronic components of this circuit has sent this signal. Similarly, the printed circuit, using its electro-optical conversion means, has converted the electrical signal into this optical signal. In both examples, the printed circuit implements electro-optical conversion means. Now these means release a quantity of heat that must be discharged to ensure the functioning of the electro-optical conversion. It is then necessary to provide for an additional heat sink on the printed circuit to discharge this heat.

The electro-optical connections of the prior art raise a problem. Indeed, the amount of space taken up by such electro-optical devices is great. Firstly, the optical signal is necessarily transmitted to a printed circuit by means of a connector. Secondly, this optical signal then has to be converted into an electrical signal in the printed circuit. With present-day conditions of miniaturization, the presence of the electro-optical conversion means and of a heat sink in the printed circuit requires a great deal of space. Furthermore, this space requirement of a structure of this kind is all the greater as the connector to be mounted on the printed circuit has to be positioned very precisely in order to make sure that the optical signal is transmitted. The means for aligning the connector entail an additional space requirement.

Furthermore, electronic components that carry out the signal processing and also the electro-optical conversion release much energy. An additional space requirement is created by the necessary presence of a heat sink on the printed circuit.

Consequently, the printed circuit has to be solid and therefore thick and rigid so that it can receive an optical connector, have electrical components and at the same time support a heat sink. The prior art electro-optical connector therefore raises a problem of the space that it takes up.

In order especially to obtain a link which, for the user, is similar to an electrical link, for bit rates of over one gigabit/s, the invention proposes the making of a link based on the use of a pair of modules, each of the modules having an electrical interface that can be dismantled, this pair of modules being connected by an optical channel.

It is an object of the invention to overcome the problem referred to by proposing an electro-optical connector receiving an optical fiber at a first end and having electrical contacts at a second end. Indeed, the electro-optical connection module of the invention comprises means to convert the optical signal emitted by the optical fibers into an electrical signal. Conversely, these conversion means of the connector can also convert an electrical signal received by the electrical contact into an optical signal to be conveyed by the optical fiber. To this end, the connection module comprises a printed circuit comprising a first portion at which the optical signal sent by the optical fiber may be received and then converted into electrical signals. And in one variant, this first portion of a printed circuit may convert an electrical signal into an optical signal, the optical signal being then sent to the optical fiber.

Furthermore, this printed circuit comprises at least one end at which electrical contacts are mounted. Preferably, the circuit comprises two printed circuit ends, positioned on either side of the first printed circuit portion. One advantage of the invention is that it proposes a connection module having a plug shape for connection to a complementary device. For this purpose, the electrical contacts of the printed circuit are brought together at the second end of this connector. Then, the printed circuit comprises at least one flexible printed circuit portion to connect the first end of the printed circuit with the end of this printed circuit. In one preferred example, a first flexible portion is positioned at a first side of the first portion and a second flexible portion is positioned at a second side of the first portion, this second side being opposite to the first side. The two flexible printed circuit ends are then each respectively connected to a flexible portion.

Thus, in a minimum environment, it is proposed to make an optical link between two modules and to carry out a conversion of the electrical signals or the optical signals at the modules, the modules furthermore comprising an electrical connector setting up an electrical connection of this connector with a complementary device, for example on a printed circuit. The optical signal conveyed by the optical fiber is directly converted into an electrical signal at the module. The presence of the conversion means at the module limit the space requirement of the printed circuit designed to receive such a module. Furthermore, this complementary printed circuit undergoes no excessive heating and therefore does not require any specific heat sink. Finally, since the conversion means are present in the module, it becomes easy to replace them when necessary. Indeed, the module can be detached for repairs, whereas replacing these means when they are mounted on the printed circuit for the reception of an optical converter would require the replacement of the entire printed circuit.

The invention therefore relates to an electro-optical connection module comprising a printed circuit, at least one optical component and possibly a control electronic circuit and at least two electrical connectors, characterized in that the printed circuit comprises two flexible printed circuit portions positioned respectively on either side of a rigid portion of this circuit and in that the two flexible printed circuit portions each comprise an end and each have an electrical connector mounted on this end, the ends being brought closer to each other to form an electrical plug.

The invention will be understood more clearly from the following description and the appended figures. These figures are given purely by way of an indication and in no way restrict the scope of the invention. Of these figures.

Figure 1:
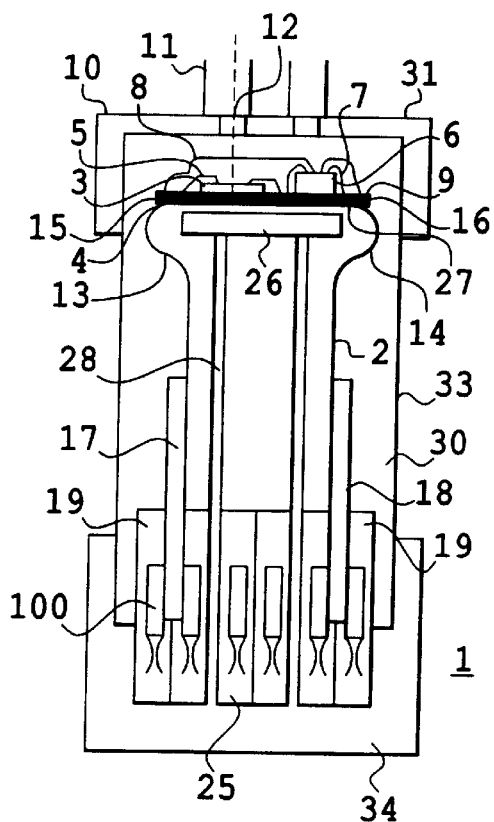
FIG. 1 is a sectional view of an electro-optical connection module according to the invention.

FIG. 1 shows an electro-optical connection module 1 according to the invention. The module 1 has a printed circuit 2. The printed circuit 2 has an optical component 3 mounted on the surface of a rigid portion 4 of this printed circuit 2. The optical component 3 is mounted for example on the surface of the rigid portion 4. In the example shown in FIG. 1, the component 3 is connected by wires 5 soldered firstly to the rigid portion 4 and secondly to connection wells (not shown) of the optical component 3. The optical component 3 is for example an optical transmitter and/or receiver. For example, it has photodiodes and VCSEL (vertical cavity solid emitting laser) emitter diodes. The wires 5 are used for example to connect the optical component 3 to electrical tracks (not shown) of the printed circuit 2.

The rigid portion 4 may have other electronic components 6. For example, another electronic component 6 may be an amplifier, or again a signal-processing component or again a driving circuit. In the example shown in FIG. 1, the other electronic components 6 are connected by a method known as direct bonding, used for very high bit rate applications, or by wires 7 soldered to the rigid portion 4. Thus, using conductive tracks of the rigid portion 4, the optical component 3 may be connected to the other electronic components 6. In a preferred embodiment, the optical component 3, the other electronic component 6 and the wires 5 and 7 are covered with an insulating material 8 transparent to the wavelength sent or received by the optical components. This insulating material 8 also covers the upper surface 9 on which the components 3 and 6 are presented.

The amplifier and/or the driving circuit may for example be characterized by a frequency of about 2.5 Gigabits per second (Gbit/s) and may be CMOS type components, using Si (silicon) and Ge (germanium) materials.

The rigid portion 4 therefore has means to receive optical signals. To this end, the rigid portion 4 is positioned in the module 1 in such a way that it is presented perpendicularly to a face 10 of the module 1 such that this face 10 receives at least one optical fiber 11. The face 10 is designed in such a way that it has an end 12 of the optical fiber 11 facing the optical component 3.

The printed circuit 2 also has a first flexible portion 13. In the preferred example, it has a second flexible portion 14. In this case, the first flexible portion 13 is positioned on a first side 15 of the rigid portion 4. Correspondingly, the second flexible printed circuit portion 14 is positioned on a second side 16 of this same rigid portion 4. The second side 16 is preferably opposite the first side 15. Indeed, the rigid portion 4 preferably has a parallelepiped shape in this example. In a preferred embodiment, the conductive tracks presented on the rigid portion 4 are also continued in the flexible printed circuit portions 13 and 14.

Furthermore, the printed circuit 2 has a first printed circuit end 17. This first printed circuit end 17 is connected by means of the first flexible printed circuit portion 13 to the rigid portion 4. In a preferred example, the printed circuit 2 has a second printed circuit end 18. Similarly, this second end 18 is connected by means of the second flexible printed circuit portion 14 to this same rigid portion 4.

The printed circuit 2 is therefore characterized by five distinct zones. Schematically, the rigid portion 4 is positioned in a median zone and is positioned between two flexible printed circuit portions 13 and 14 and is connected by means of these flexible printed circuit portions to the two printed circuit ends 17 and 18. The five flexible zones and/or rigid zones of the printed circuit may be made in one piece. It is also possible to carry out a soldering operation to connect the ends of the flexible parts on the rigid part.

In one of the steps of the assembly of the module 1 according to the invention, these different zones are placed in one and the same plane. In the final version of the mounted module 1, the rigid portion 4 and the printed circuit ends 17 and 18 are no longer in this same plane.

The printed circuit ends 17 and 18 have electrical connectors 19. In one preferred embodiment, each of the ends 17 and 18 comprises an electrical connector 19. In FIG. 1, the module 1 has at least two electrical connectors 19.

Figure 2:
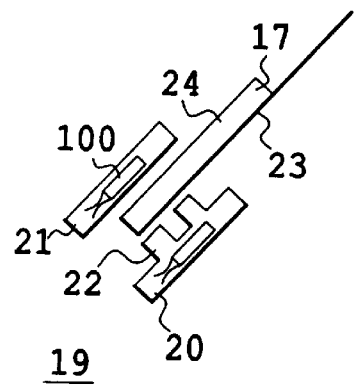
FIG. 2 is a sectional view of a dismounted end of a module according to the invention.

FIG. 2 shows an exemplary connector 19 that can be mounted on an end such as 17 or 18. The connector 19 then has a first half 20 designed to be associated with a second half 21 in such a way that the halves 20 and 21 are hooked to each other. To this end, the first half 20 has two tongues 22 designed to get clipped into the second half 21. In a preferred mounting of the connector 19 on the end 17, the first half 20 is placed on of a first side 23 of the end 17 while the second half 21 is placed on a second side 24 of the same end 17. Thus, when the two halves 20 and 21 are brought close to each other, the end 17 becomes trapped between these two halves 20 and 21. The end 17 is sandwiched between the two halves 20 and 21.

The connector 19 is presented in such a way that it can receive a complementary connector when there is a connection, if any, with this half 20 or 21.

In a preferred example, the halves 20 and 21 each have a row 25 of contacts 100. In the example shown in FIG. 2, the contacts 100 are female contacts designed to receive male pins. Thus, the end 17 in this example carries ten contacts 100. Similarly, the end 18 which is made symmetrically, has also two rows 25 and ten contacts such as 100.

Furthermore, the module 1 according to the invention has a third connector such as 19. This third connector is designed to be positioned between the contacts mounted on the first end 17 and the contacts mounted on the second end 18. For example it has two rows such as 25, each row also having five contacts such as 100, giving ten contacts. In this case, the module 1 has an end with thirty contacts such as 100. The third connector essentially has a function of assistance in inserting the module 1 in the male part.

In this preferred embodiment of the module 1, there is first of all a printed circuit 2 in a frame so that the printed circuit 2 forms a plane and the ends 17 and 18, the flexible portions 13 and 14 and the rigid portion 4 are coplanar. This frame rigidifies the printed circuit 2, which nevertheless has flexible portions, during the subsequent mounting of the optical component 3, the complementary electronic devices 6 and the electrical connectors such as 19 around the ends 17 and 18.

Then, once the different components and connectors are mounted on the printed circuit 2, the frame, if any, that has been used is removed and the printed circuit 2 is curved at the two flexible printed circuit portions 13 and 14. Thus, the ends 17 and 18 of the printed circuit 2 are positioned more particularly in a perpendicular manner with respect to the rigid portion 4. An angle formed by the flexible printed circuit portion 13 between the end 17 and the rigid portion 4 is an angle of about 90° along a radius of curvature determined by the thickness of the flexible part. In a preferred example, this angle is greater than 90° so as to leave a certain flexibility of positioning of the end 17 with respect to the rigid portion 4. The positioning of the end 18 is achieved symmetrically with respect to the rigid portion 4. With this assembly, the ends 17 and 18 are mutually parallel.

The rows 25 of contacts 100 presented by the ends 17 and 18 are also mutually parallel.

The rigid portion 4 sends a large quantity of heat since it has the components 6 carrying out the electro-optical conversion of the optical signals received by the optical component 3 and the active components. In a preferred embodiment, the module 1 has a heat sink 26. The heat sink 26 is preferably positioned on a lower face 27 of the rigid portion 4. This lower face 27 is opposite the upper face 9. The heat sink 26 is bonded for example to this lower face 27. This heat sink is also used to rigidify the central part at the flexible starting point and is used as a base to fasten the optical and electronic components.

Figure 3:
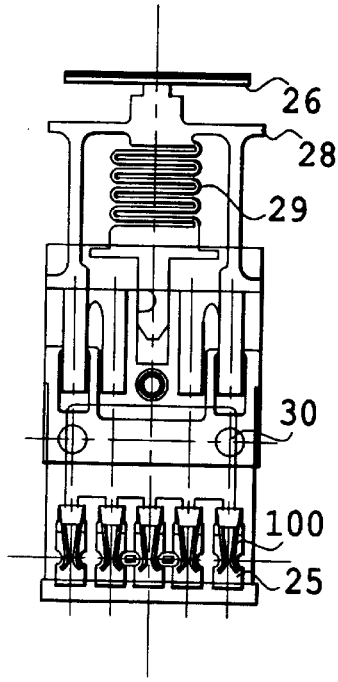
FIG. 3 is a longitudinal partial sectional view of a module according to the invention.

Furthermore, in one variant, it is possible to provide for complementary devices to discharge heat. Indeed, it is also possible to link the heat sink 26 by bonding or soldering to a spring 28. For example, FIG. 3 shows a spring 28 of this kind. This spring 28 is preferably elongated, perpendicularly to the rigid portion 4, between the ends 17 and 18, parallel to these ends. The spring 28 corresponds to a thin plate comprising a cut-out portion that leaves a spring 29. This cut-out spring portion 29 is an enlarged heat exchange surface for better dissipation of heat. A spring 28 of this kind is held for example between two rows of contacts such as 25. It is held for example by means of a hole 30 working together with complementary means presented by the rows 25 of contacts. The spring 28 is for example supported against a lower face 27 of the rigid portion 4, at a first end. At a second end, it is for example supported against an internal face of an end 17 or 18 of the printed circuit. This internal face is opposite the face of these same ends supporting the contacts 100.

In the example shown in FIG. 1, the module 1 has two springs such as 28. A first spring is blocked between the contacts 100 of one row of the end 17 and the third row such as 25. And a second spring is blocked between this third row such as 25 and a row of contacts presented on the second end 18.

Figure 4:
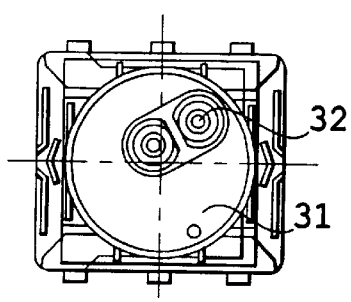
FIG. 4 is a top view of a rigid portion of a module according to the invention.

The module 1 thus described is preferably positioned in a front part beneath a lid 31 mounted above the rigid portion 4 so as to present the optical fibers 11. To this end, the lid 31 has holes 32 for the positioning, at an end 12, of a fiber 11 facing an optical transmitter and/or receiver of the optical component 3. FIG. 4 shows a top view of this lid 31. The lid 31 therein has two holes 32 each designed respectively to receive an optical fiber I1.

Figure 5:
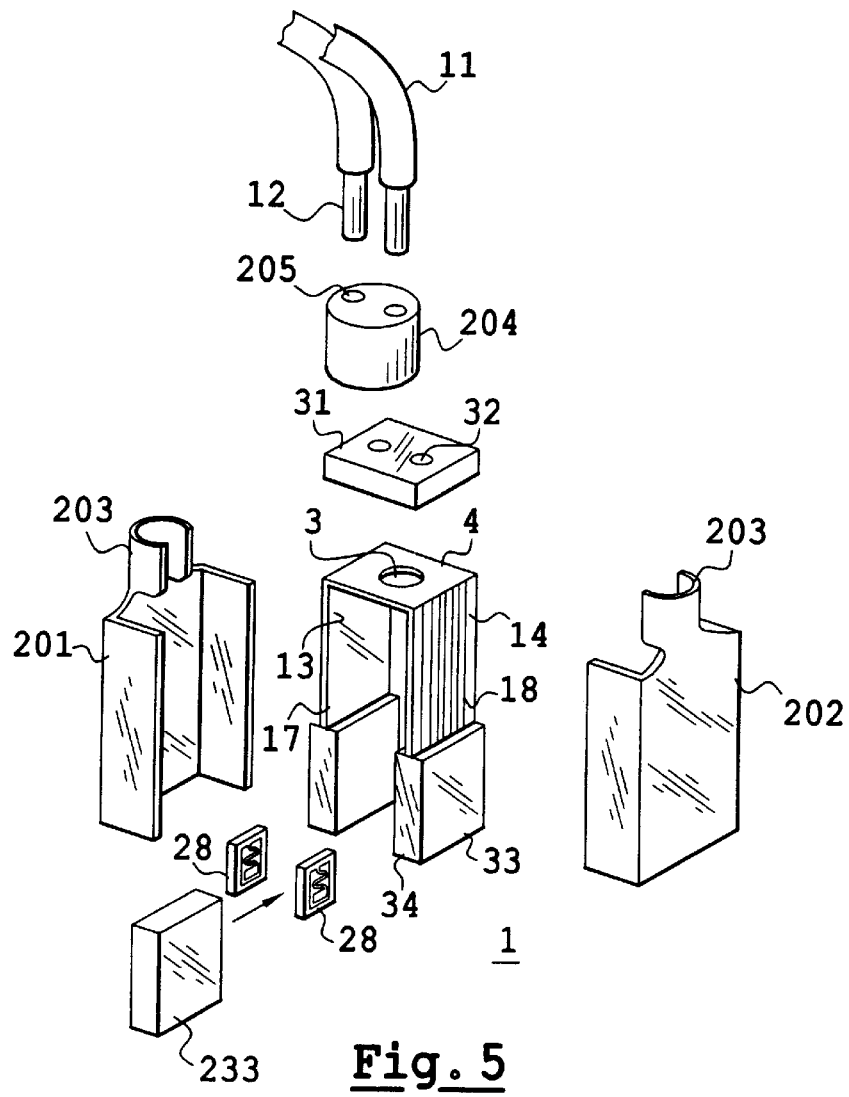
FIG. 5 is an exploded view of a module according to the invention.

In a rear part, the portions 17 and 18 of the printed circuit 2 are each surrounded by package elements 33. These package elements 33 are preferably insulating elements and juxtaposed with each other so as to form a connection end 34 to present the contacts 100. In an embodiment shown in FIG. 5, each package element 33 comprises two half-packages.

This contact end 34 has a special geometry that is adapted for connection with a complementary connector. Since the contacts 100 are presented at the connection end 34, this end forms an electrical plug. In a preferred example, the module 1 has two electrical plugs such as 34, a plug 34 comprising two rows such as 25, each row having five contacts 100. In this embodiment shown in FIG. 5, the pairs of assembled half-packages are separated by an insulating package element 233. This insulating package element 233 is preferably positioned between two spring elements such as 28. This package element 233 is used to ensure a minimum constant spacing between the two heat sinks.

Furthermore, the entire module 1 thus comprises chiefly the rigid printed circuit portion 4 and the plug formed by the connection end 34. This module 1 is designed in such a way that it has a parallelepiped shape. It can then be surrounded by a reinforcement frame. In the example shown in FIG. 5, the reinforcement frame comprises rigid half-shells 201 and 202 that can be attached together around the module 1. When two half-shells are assembled, they preferably form an electromagnetic shielding cover and, in this case, they are made of metal.

In a preferred embodiment, the module 1 is shielded and the half-shells respectively have a duct portion 203 forming a tube for the exit of the optical fibers 11 when these half-shells are assembled. The duct 203 is designed to enable the exit of a cable mounted on the module 1.

Furthermore, the module 1 has a guiding element 204 for the optical fibers 11. To this end, the guiding element is positioned above the lid 31 and has canals 205 to receive an optical fiber 11 each. The optical fibers presented by this element 204 are perfectly positioned and moved away from each other so that, in a single handling operation, all the optical fibers 11 can be accurately presented before the holes 32. Furthermore, this guiding element 204 can also have insulator functions and functions of mechanical protection for these optical fibers 11. This guiding element is gripped in the duct 203.

Figure 6:
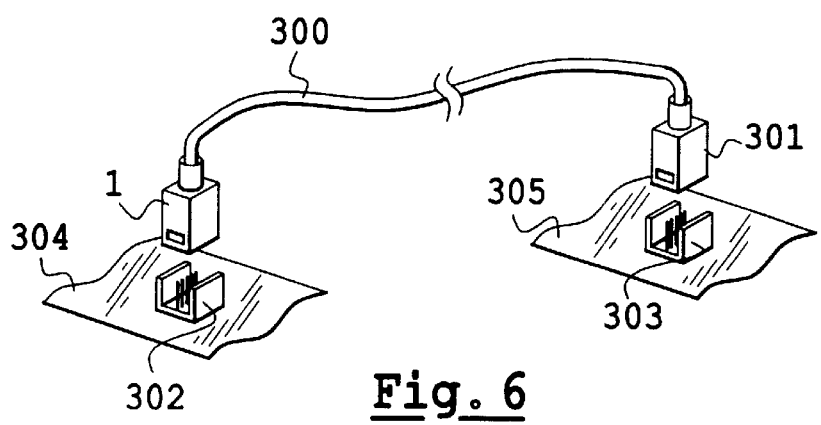
FIG. 6 is a view of a mode of use of a module according to the invention.

FIG. 6 has a module 1 connected by means of a cable 300, this cable having optical fibers 11, to a second module 301 such as the module 1. The module 1 is for example connected with a complementary connector 302. This connector 302 is complementary to the connection ends 34 and contact ends 100. In the present case, the complementary contacts are then pins.

Similarly, the module 301 is connected to the cable 300 and connected with a second complementary connector 303 such as 302. In the example shown, the connectors 302 and 303 are positioned on distinct printed circuits 304 and 305. Thus, through solely electrical interconnections between the complementary connectors 302 and 303, and the modules 1 and 301, the invention provides optical fiber conduction for the signals conveyed between these complementary connectors 302 and 303.

What is claimed is:

1. An electro-optical connector comprising a printed circuit, at least one electro-optical component adapted to be communicably connected to an optical fiber, a control electronic circuit, and at least two electrical connectors, characterized in that the printed circuit comprises two flexible printed circuit portions positioned respectively on either side of a rigid portion of the circuit, and in that the two flexible printed circuit portions each comprise an end and each have an electrical contact mounted on the end, the ends being brought closer to each other to form an electrical plug.

2. The connector according to claim 1, characterized in that the rigid portion has the elecro-optical component as well as components of an electronic control circuit.

3. The connector according to claim 1, characterized in that the ends of the two flexible portions form an angle of about 90° with the rigid portion.

4. The connector according to claim 1, characterized in that the plug is complementary to an electrical connector socket.

5. The connector according to claim 1, characterized in that the ends each bearing at least one electrical contact are inserted in elements of insulating packages juxtaposed so as to form an electrical connector comprising rows of contacts.

6. The connector according to claim 5 characterized in that the insulating packages elements carrying the ends are constituted by half packages separated by at least one insulating package element forming a spacing element.

7. The connector according to claim 1, characterized in that the connector further comprises at least one spring element to discharge the heat, this spring element having one first end supported against a lower face of the rigid portion and a second end fixedly joined with the ends of the flexible circuit portions.

8. The connector according to claim 1, characterized in that the rigid portion and the plug respectively form an upper face and a lower face of the connector, the connector having a parallelepiped shaped, and in that a reinforcement frame surrounds the lateral faces of the parallelepiped.

9. The connector according to claim 8 characterized in that the reinforcement frame is shaped in the form of two metal half-shells forming an electromagnetic shielding cover.

10. The connector according to claim 1, characterized in that the rigid portion comprises an upper face receiving the electromagnetic component, this upper face receiving a lid provided with apertures for the passage and alignment of optical fibers positioned facing the electro-optical component.

11. The connector according to claim 9 characterized in that at least one of the half-shells comprises a duct portion going beyond the rigid portion, this duct gripping a guiding element for optical fibers.

* * * * *